United States Patent
Schroeder et al.

(10) Patent No.: US 9,940,812 B2
(45) Date of Patent: Apr. 10, 2018

(54) CIRCUIT PROTECTIVE DEVICE FAULT DIAGNOSTIC TRANSLATOR

(71) Applicant: SCHNEIDER ELECTRIC USA, INC., Schaumburg, IL (US)

(72) Inventors: Jeremy D. Schroeder, Urbana, IA (US); Robert B. Isaacson, Cedar Rapids, IA (US); Timothy J. Watts, Cedar Rapids, IA (US)

(73) Assignee: SCHNEIDER ELECTRIC USA, INC., Andover, MA (US)

( * ) Notice: Subject to any disclaimer, the term of this patent is extended or adjusted under 35 U.S.C. 154(b) by 0 days.

(21) Appl. No.: 14/908,193

(22) PCT Filed: Aug. 8, 2013

(86) PCT No.: PCT/US2013/054081
§ 371 (c)(1),
(2) Date: Jan. 28, 2016

(87) PCT Pub. No.: WO2015/020653
PCT Pub. Date: Feb. 12, 2015

(65) Prior Publication Data
US 2016/0180687 A1    Jun. 23, 2016

(51) Int. Cl.
*G08B 21/18*    (2006.01)
*H02H 1/00*    (2006.01)
(Continued)

(52) U.S. Cl.
CPC .......... *G08B 21/18* (2013.01); *G01R 31/3275* (2013.01); *H01H 9/167* (2013.01);
(Continued)

(58) Field of Classification Search
CPC .......... G08B 21/00; G08B 21/18; H02H 3/04; H02H 3/38; H02H 1/0015; H01H 71/04;
(Continued)

(56) References Cited

U.S. PATENT DOCUMENTS

| | | | | |
|---|---|---|---|---|
| 5,335,135 A | * | 8/1994 | Kinney | H02H 3/34 361/65 |
| 5,600,526 A | | 2/1997 | Russel et al. | |

(Continued)

FOREIGN PATENT DOCUMENTS

| | | |
|---|---|---|
| DE | 197 07 729 A1 | 8/1997 |
| DE | 102 48 640 A1 | 4/2004 |

(Continued)

OTHER PUBLICATIONS

International Search Report and Written Opinion for PCT/US2013/054081 dated Jan. 29, 2014, 14pp.
(Continued)

*Primary Examiner* — Mirza Alam
(74) *Attorney, Agent, or Firm* — Locke Lord LLP

(57) ABSTRACT

An apparatus (100) and method are provided for translating diagnostic information provided by a circuit protective device, such as a circuit breaker, to a graphic display format. The apparatus and method monitor through a sensor (120) a trip sequence implemented by the circuit protective device as a function of time during a read out operation to indicate a type of fault condition from a plurality of fault conditions for a prior occurrence of a trip event or diagnostic information. The apparatus and method then determine a time period of the monitored trip sequence, and determine the type of fault condition based on the determined time period. Information concerning the determined type of fault condition is outputted.

17 Claims, 5 Drawing Sheets

(51) Int. Cl.
  *H02H 3/04* (2006.01)
  *G01R 31/327* (2006.01)
  *H02H 3/38* (2006.01)
  *H01H 9/16* (2006.01)
  *H01H 71/04* (2006.01)

(52) U.S. Cl.
  CPC .......... *H01H 71/04* (2013.01); *H02H 1/0061* (2013.01); *H02H 3/04* (2013.01); *H02H 3/38* (2013.01); *H01H 2071/042* (2013.01); *H01H 2071/048* (2013.01)

(58) Field of Classification Search
  CPC ..... H01H 71/74; G01R 31/3275; Y04S 10/30; A61B 5/00
  See application file for complete search history.

(56) References Cited

U.S. PATENT DOCUMENTS

| | | | |
|---|---|---|---|
| 5,642,052 | A | 6/1997 | Earle |
| 5,844,493 | A | 12/1998 | Pohl et al. |
| 8,243,411 | B2 | 8/2012 | Larson |
| 2003/0067725 | A1 | 4/2003 | Horvath et al. |
| 2009/0206059 | A1* | 8/2009 | Kiko .......... H02J 3/14 218/143 |
| 2009/0213505 | A1 | 8/2009 | Conrad et al. |
| 2010/0073830 | A1* | 3/2010 | Schweitzer, III ......... G01J 1/02 361/42 |
| 2010/0085206 | A1 | 4/2010 | Nayak et al. |
| 2010/0321837 | A1* | 12/2010 | Caiti ....................... H02H 1/06 361/18 |
| 2011/0012603 | A1 | 1/2011 | Bose et al. |
| 2013/0062172 | A1* | 3/2013 | Shvach ................. H01H 71/04 200/308 |
| 2014/0254052 | A1* | 9/2014 | Carlino ................... H02H 1/06 361/62 |
| 2015/0168487 | A1* | 6/2015 | Parker ............... G01R 31/2837 702/58 |

FOREIGN PATENT DOCUMENTS

| | | |
|---|---|---|
| EP | 0 678 890 A1 | 10/1995 |
| EP | 0678890 A1 | 10/1995 |
| RU | 2340058 C2 | 11/2008 |
| SU | 826484 A1 | 4/1981 |
| WO | WO 96/07192 A2 | 3/1996 |

OTHER PUBLICATIONS

Extended European Search Report for Application No./Patent No. 13891236.5-1806 / 3031107 PCT/US2013054081 dated Feb. 15, 2017.

RU Office Action for Application No. 2016105070/07 dated Aug. 16, 2017.

RU Search Report for Application No. 2016105070/07 completed Aug. 16, 2017.

* cited by examiner

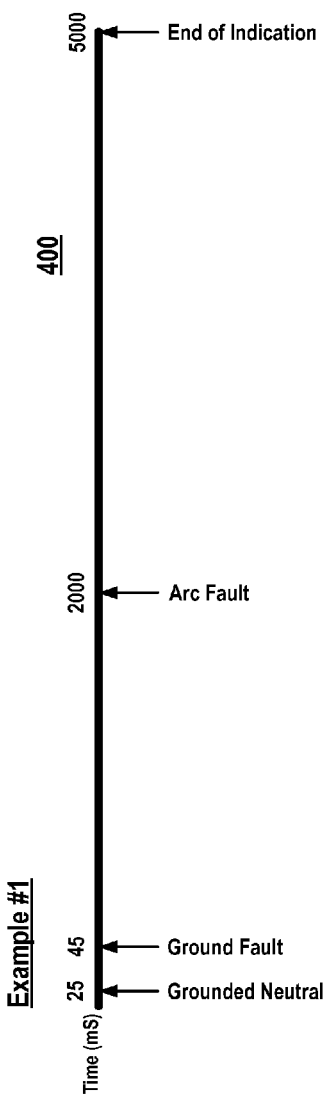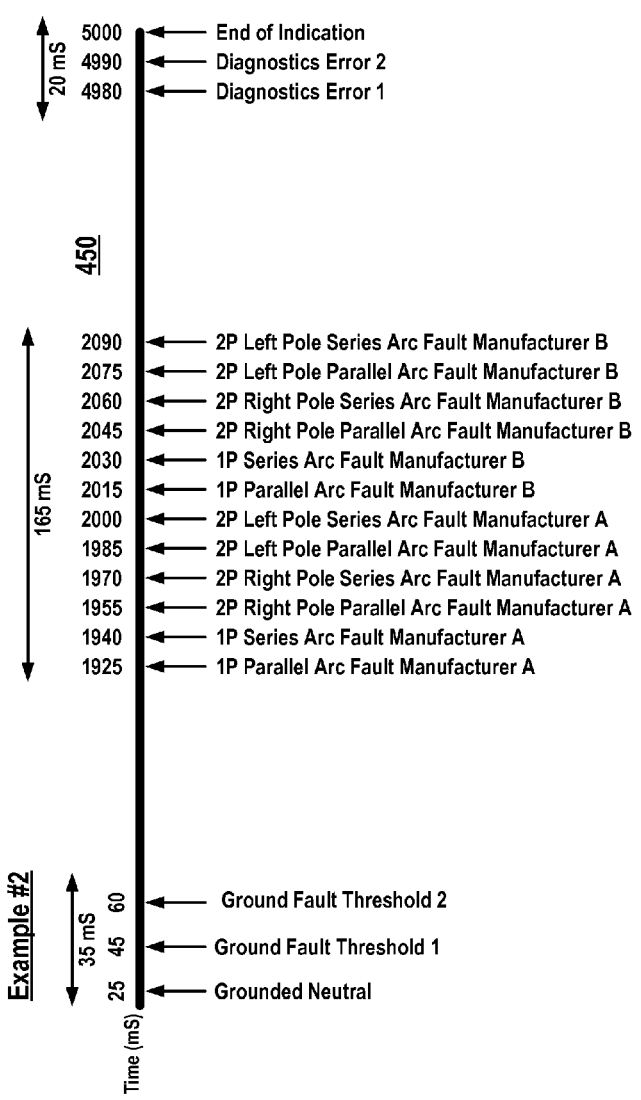

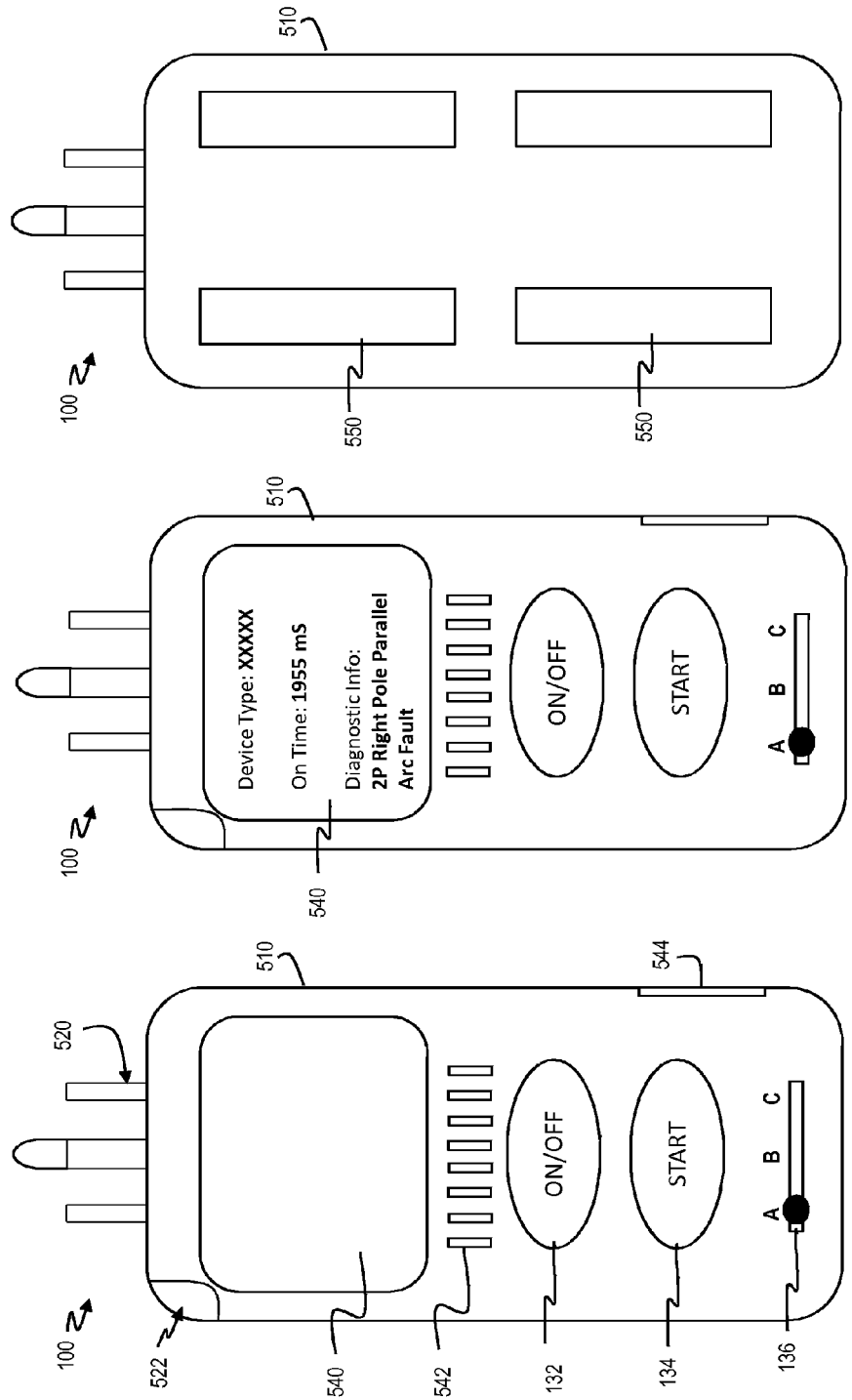

CIRCUIT PROTECTIVE DEVICE FAULT DIAGNOSTIC TRANSLATOR

FIELD

The present disclosure relates to the field of circuit protection, and more particularly, to an approach for translating diagnostic information provided by a circuit protective device.

BACKGROUND

Circuit breakers are used to protect circuits against many different types of electrical fault and overcurrent conditions. When a circuit breaker interrupts current to a circuit, it may be challenging for a person to troubleshoot the protected circuit without any knowledge about the interruption. As a consequence, some circuit breakers now incorporate user diagnostic features. One common diagnostic feature involves the use of Light-Emitting Diodes (LEDs) on the circuit breaker to indicate a reason why a circuit breaker tripped. The LEDs on the circuit breaker can be used to display a trip code, which indicates a particular type of fault condition. However, the use of LEDs has a drawback of adding cost and complexity to the circuit breaker.

Another circuit breaker diagnostic feature is described in U.S. Pat. No. 8,243,411 to Brett Larson (the "Larson patent"), entitled "Electronic Miniature Circuit Breaker With Trip Indication Using The Breaker Tripping Function As The Feedback Mechanism". In one embodiment of the Larson patent, a circuit breaker is configured to convey diagnostic information, such as a type of fault condition, concerning a prior occurrence of a trip event by implementing a trip sequence (or indication) as a function of time during a read out operation. For example, an arc fault condition is indicated by having the circuit breaker trip after a certain time delay (e.g., the handle is moved to an ON position and then to the TRIPPED position after a delay of two seconds), and a ground fault condition is indicated by having the circuit breaker trip after another certain time delay (e.g., the handle is moved to an ON position and then to the TRIPPED position after a delay of four seconds), wherein contacts of the circuit breaker are closed in the ON position and are opened in the TRIPPED position.

While the diagnostic feature of the Larson patent does not result in any additional cost or add significant complexity to the circuit breaker, it may be difficult for some users to distinguish between different indication time periods of a trip sequence during a read out operation. The movement of the circuit breaker handle to the tripped position may also confuse users with little or no technical experience during the read out operation. Furthermore, by relying on human senses to determine an indication time period of the trip sequence during the read out operation, the circuit breaker is limited in a number of types of fault conditions conveyable as a function of time since humans cannot easily distinguish time periods that differ in the seconds to sub-second range.

SUMMARY

Accordingly, the present disclosure provides an apparatus and method for translating diagnostic information provided by a circuit protective device, such as a circuit breaker. The apparatus and method monitor through a sensor a trip sequence implemented by the circuit protective device as a function of time during a read out operation to indicate a type of fault condition from a plurality of fault conditions for a prior occurrence of a trip event or diagnostic information, determine a time period of the monitored trip sequence, determine the type of fault condition based on the determined time period, and output information indicating the determined type of fault condition. The trip sequence can be monitored using sensors, such as an acoustic sensor (e.g., a microphone), a voltage probe or a current probe, to detect operation of the circuit protective device, such as whether the device is in an ON position or a TRIPPED position. Furthermore, two different types of fault conditions from the plurality of fault conditions can be associated with time periods which are less than what is discernible by human recognition.

The apparatus and method of the present disclosure provide various benefits. For example, the apparatus and method provide diagnostic information, such as fault condition indications, in a form that may be easily understood by a user, and do not require any additional cost or complexity to the circuit protective device. The apparatus and method also do not require human-based time measurement of a trip sequence, and thus, provide for improved accuracy in translating the type of diagnostic information indicated by the circuit protective device during a read out operation. Furthermore, the apparatus and method allow more types of diagnostic information to be conveyed by the circuit protective device as a function of time within a specified time interval, and are particularly useful when employed in combination with more complex circuit protective devices, such as multi-pole circuit breakers and circuit breakers that include a combination of different circuit interrupters, e.g., an arc fault circuit interrupter and a ground fault circuit interrupter.

BRIEF DESCRIPTION OF THE DRAWINGS

The description of the various exemplary embodiments is explained in conjunction with the appended drawings, in which:

FIGS. 4A and 4B are exemplary diagnostic information databases, shown in a chart form, that maintain information as to different types or sub-types of diagnostic conditions, such fault conditions, in relation to a time period of a trip sequence implementable by one or more circuit protective devices during a read out operation in accordance with an embodiment of the present disclosure; and FIGS. 5A, 5B and 5C are exemplary front view, front view and back view, respectively, of the diagnostic translation device of FIG. 1 in accordance with another embodiment of the present disclosure.

DETAILED DESCRIPTION

In accordance with various disclosed embodiments, there is provided a diagnostic translation device and method, which translate diagnostic information provided by a circuit protective device through a trip sequence (also referred to as a "trip indication") implemented as a function of time during a read out operation. The diagnostic information conveys diagnostic conditions, such as a fault condition, which may be expressed as an error code (e.g., a trip code), that occurred in relation to a trip event on the circuit protective device. The circuit protective device can include any type of circuit breaker or circuit interrupter, such as a single pole circuit breaker, a multi-pole circuit breaker, an Arc Fault Circuit Interrupter (AFCI) or a Ground Fault Circuit Interrupter (GFCI) or a combination thereof. An example of a circuit protective device is described in the Larson Patent, which is discussed above in the Background section.

Figure 1:
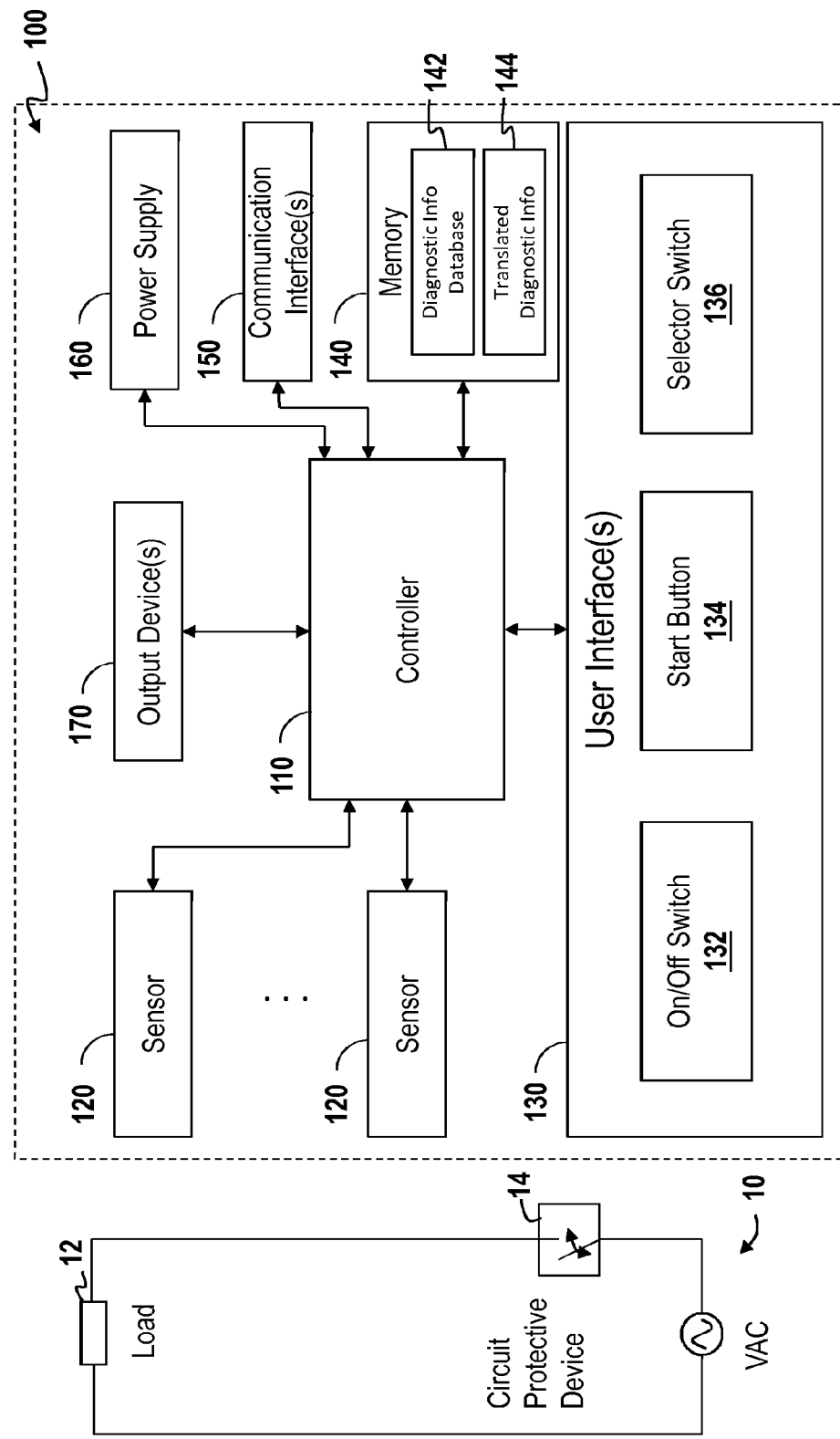
FIG. 1 illustrates a block diagram of an exemplary diagnostic translation device for translating diagnostic information provided from a circuit protective device as a trip sequence implemented as a function of time during a read out operation in accordance with an embodiment of the present disclosure.

FIG. 1 illustrates a block diagram of exemplary components of a diagnostic translation device 100. As shown in FIG. 1, the diagnostic translation device 100 includes a controller 110, a plurality of sensors 120, a user interface(s) 130, a memory 140, a communication interface(s) 150, a power supply 160 and output device(s) 170. The power supply 160 can include a battery power unit, which can be rechargeable, or a unit that provides connection to an external power source.

The sensors 120 monitor or sense activities of a circuit protective device 14 connected to a circuit 10 (e.g., a branch circuit), and output signals to the controller 110. The activities can include when the circuit protective device 14 is placed in an ON position and in a TRIPPED position. The sensors 120 can include a voltage sensor or a current sensor, which can be used to sense electrical characteristics, such as a voltage or current, through the circuit 10 or a load 12 connected to the circuit 10. By sensing the electrical characteristics of the circuit 10 or the load 12, it is possible to detect when the circuit protective device 14 is placed in an ON position such as if a threshold amount of current or voltage is detected on the circuit 10 or load 12, or in a TRIPPED position such as when there is no current or voltage detected on the circuit 10 or load 12.

The sensors 120 can also include an acoustic sensor, such as a microphone, for monitoring or sensing sounds. The acoustic sensor can be used to detect an acoustic signature relating to mechanical operations of the circuit protective device 14 when placed in the ON position and the TRIPPED position. Furthermore, the sensors 120 may include other types of sensors, such as a motion sensor, which can be used to sense movement relating to mechanical operations of the circuit protective device 14, such as its handle, when placed in the ON position and the TRIPPED position.

The sensors 120 may also include, or be connected to, signal conditioning circuits, threshold detectors, filters and analog-to digital converters for processing the sensed data prior to output to the controller 110.

The user interface(s) 130 may include a plurality of user input devices through which a user can input information or commands to the diagnostic translation device 100. The user interfaces(s) 130 can include an On/Off switch 132, a Start button 134 and a Selector switch 136. The On/Off switch 132 is configured to receive user input to turn ON or OFF the diagnostic translation device 100. The Start button 134 is configured to receive user input to start a diagnostic translation operation of information to be provided by a circuit protective device through a tripping sequence during a read out operation. The Selector switch 136 is configured to receive user input identifying a type or category of the circuit protective device to be monitored. The user interface(s) 130 may include other input devices, such as a keypad or a touch-screen display, through which a user can input information or commands, including the commands provided through the On/Off switch 132, the Start button 134 and the Selector switch 136.

The output devices 170 can include a display, a plurality of light emitting diodes (LEDs) and a speaker or other devices which are able to convey information to a user. The communication interface(s) 150 can include communication circuitry for conducting line-based communications with an external device such as a USB or Ethernet cable interface, or for conducting wireless communications with an external device through a wireless personal area network, a wireless local area network, a cellular network or wireless wide area network. The communication interface(s) 150 can be used to receive updates to the diagnostic information database 142 (e.g., new or revised time periods and error codes for current or new types of circuit protective devices) from an external device, to report data in the translated diagnostic information 144 to an external device, or to allow remote control of the diagnostic translation device 100 by an external device.

The memory 140 can store computer executable code or programs, which when executed by the controller 110, controls the operations of the diagnostic translation device 100. The memory 140 also includes a diagnostic information database 142 that stores information concerning diagnostic conditions, such as fault conditions, as a function of a time period of a trip sequence. Examples of the diagnostic information database 142 are shown and described below with reference to FIGS. 4A and 4B. Various categories of diagnostic conditions can also be stored for different types of circuit protective devices, such as by manufacturer, brand, product or model, in the diagnostic information database 142. In this way, the diagnostic translation device 100 can be configured to translate diagnostic information for different types of circuit protective devices.

Furthermore, the memory 140 can store translated diagnostic information 144, which includes current or prior translated diagnostic information of one or more circuit protective devices. The translated diagnostic information 144 can include diagnostic information such as a type or sub-type of fault condition or other diagnostic condition, as well as a time period of a monitored tripping sequence, a time/date of the diagnostic translation operation, and a type of the monitored circuit protective device. The memory 140 may be a volatile or non-volatile memory.

The controller 110 is in communication with the memory 140. The controller 110 is a processing system, such as a microcontroller or microprocessor, which controls the operations of the diagnostic translation device 100, including the diagnostic translation operation as described herein in the present disclosure. For example, the controller 110 is configured to monitor through one or more of the sensors 120 a trip sequence implemented by the circuit protective device 14 as a function of time during a read out operation to indicate a type of diagnostic condition, such as a type of fault condition from a plurality of fault conditions for a prior occurrence of a trip event or diagnostic information. The controller 110 is also configured to determine a time period of the monitored trip sequence, determine the type of fault condition based on the determined time period, and indicate to a user the determined type of fault condition and other diagnostic information through one or more of the output devices 170.

Figure 2:
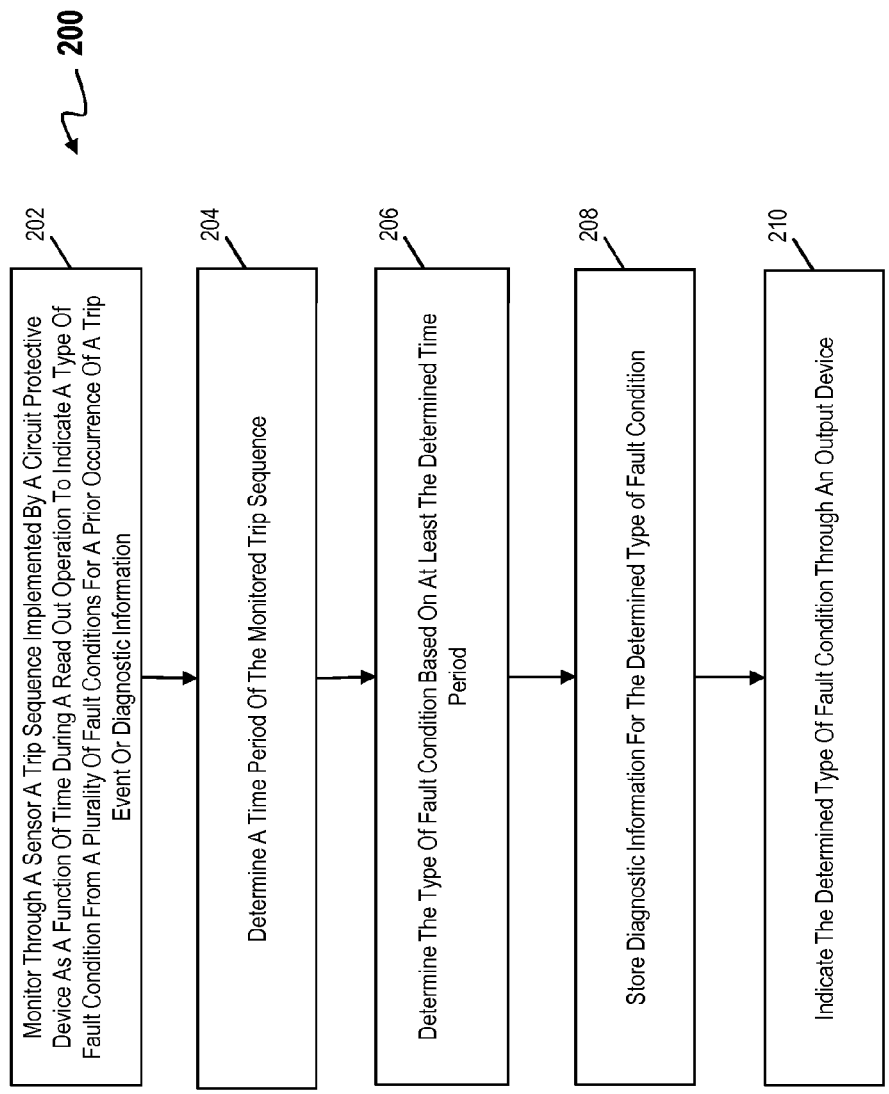
FIG. 2 is a flow diagram showing an exemplary diagnostic translation process by which the diagnostic translation device of FIG. 1 translates diagnostic information in the form of a trip sequence implemented by a circuit protective device as a function of time in accordance with an embodiment of the present disclosure.

FIG. 2 is a flow diagram showing an exemplary diagnostic translation process 200 for translating diagnostic information in the form of a trip sequence implemented by a circuit protective device connected to a circuit in accordance with an embodiment. For the purpose of explanation, the process 200 is discussed below with reference to the controller 110 and other components of the diagnostic translation device 100 in FIG. 1.

At reference 202, the controller 110 monitors through one or more sensors 120 a trip sequence implemented by a circuit protective device as a function of time during a read out operation to indicate a type of diagnostic condition, such as a fault condition from a plurality of fault conditions for a prior occurrence of a trip event or diagnostic information. As previously discussed, the sensors 120 may monitor or sense electrical characteristics on a circuit or a load connected to the circuit which reflect an operational mode of the circuit protective device, or sounds or movements relating to an operational mode of the circuit protective device. The signals from the sensors 120 may undergo conditioning prior to being sampled.

At reference 204, the controller 110 determines a time period of the monitored trip sequence based on information provided through signals output from the sensors 120. For example, by evaluating the signals from the sensors 120, the controller 110 can detect when the circuit protective device is initially placed in the ON position and when the circuit protective device is placed in the TRIPPED position. The time period is a time interval from when a contact of the circuit protective device is initially placed in the ON position (e.g., a closed position) to when the contact trips to the TRIPPED position (e.g., an open position) during the read out operation.

At reference 206, the controller 110 determines a type of diagnostic condition, such as a type of fault condition, based on at least the determined time period. The controller 110 can search the diagnostic information database 142 that stores data concerning the plurality of fault conditions in relation to time, and identify a type of diagnostic condition, e.g., fault condition, that matches the determined time period from the diagnostic information database 142. For example, if the determined time period is 1955 milliseconds, then the prior trip event on the circuit protective device is related to an Arc Fault condition and, more specifically, is associated with 2P Right Pole Parallel Arc Fault of the circuit protective device from Manufacturer A (such as shown in FIG. 4B). In addition to the determined time period, the type of diagnostic condition may also be determined based on additional parameters, such as a type of circuit protective device (e.g., number of poles, manufacturer, product, brand, model number, serial number or other information for identifying a particular type of circuit protective device to be monitored). In this way, the controller 110 is able to translate diagnostic information from various types of circuit protective devices.

At reference 208, the controller 110 stores in the memory 140 diagnostic information of the determined type of diagnostic condition, such as a fault condition, for a prior trip event that occurred on the circuit protective device. The diagnostic information of the trip event may include an identifier of the type of circuit protective device, a date/time of the diagnostic translation operation, and information on the determined type of fault condition, such as expressed as an error code or codes (e.g., a trip code or codes).

At reference 210, the controller 110 indicates the determined type of diagnostic condition, such as a fault condition, through the output device 170. The determined type of diagnostic condition may be outputted in a graphic display format or an audio format. For example, the determined type of diagnostic condition may be outputted as text or trip code(s) via a display, as audio via a speaker or as an error code via selective lighting of a plurality of LEDs. The type of diagnostic condition or other diagnostic information may also be transmitted to an external device through the communication interface(s) 150.

Figure 3:
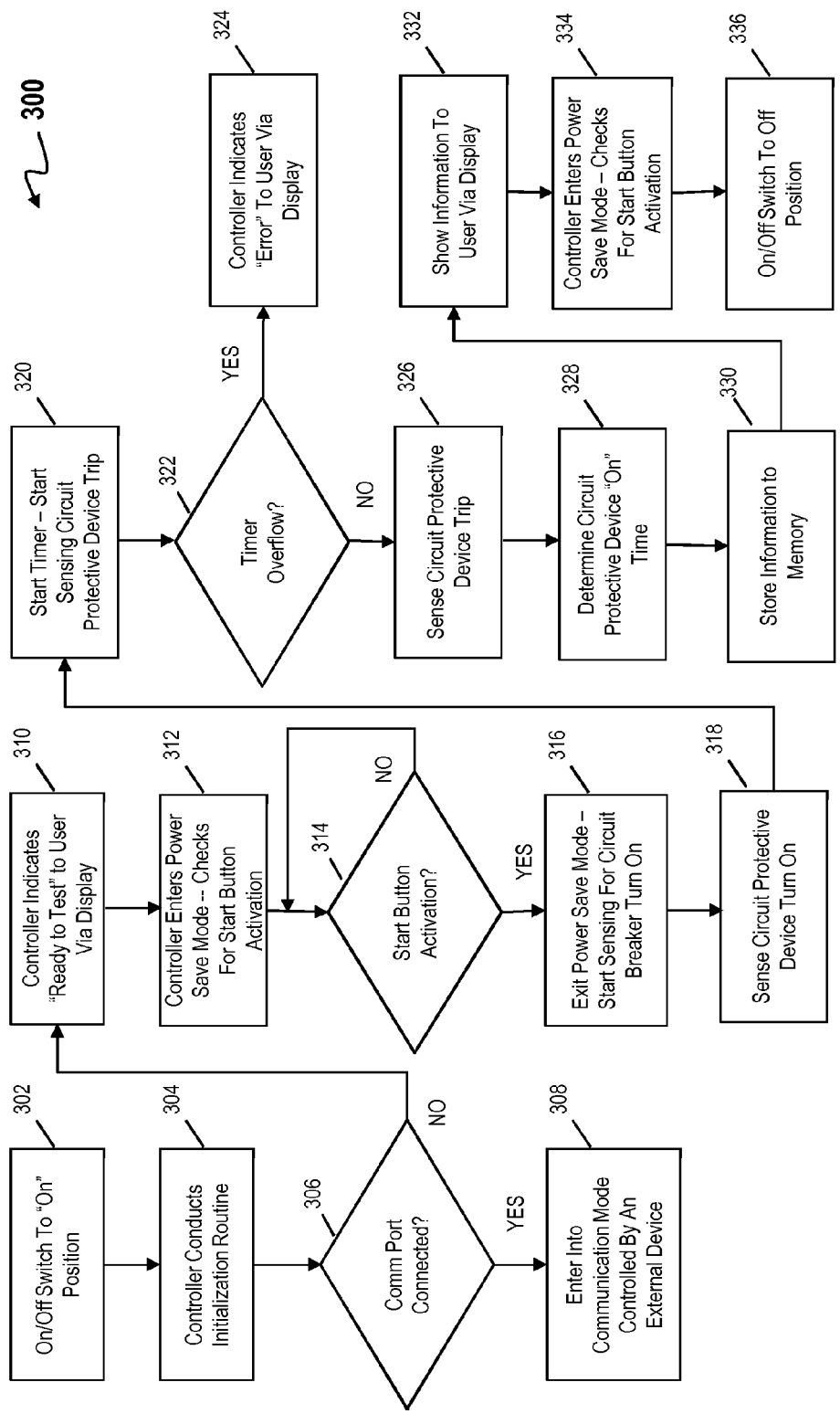
FIG. 3 is a flow diagram showing an exemplary diagnostic translation process by which the diagnostic translation device of FIG. 1 translates diagnostic information in the form of a trip sequence implemented by a circuit protective device as a function of time in accordance with a further embodiment of the present disclosure.

FIG. 3 is a flow diagram showing an exemplary diagnostic translation process 300 by which the diagnostic translation device 100 of FIG. 1 translates diagnostic information in the form of a trip sequence implemented by a circuit protective device in accordance with a further embodiment. For the purpose of explanation, the process 300 is discussed below with reference to the controller 110 and other components of the diagnostic translation device 100 in FIG. 1.

At reference 302, the diagnostic translation device 100 is turned on via an On/Off switch 132. The controller 110 of the diagnostic translation device 100 conducts an initialization routine, at reference 304. At reference 306, the controller 110 determines whether the diagnostic translation device 100 is in communications with an external device, via a communication port (e.g., any of the communication interfaces 150). The external device may be a remote server, which is operated by a manufacturer of the circuit protective device, by an entity which manages operations of the circuit protective device for residential or commercial customers or by other third party entities. If the diagnostic translation device 100 is in communication with the external device, then the diagnostic translation device 100 enters into a communication mode controlled by the external device at reference 308. For example, the diagnostic translation device 100 may implement the diagnostic translation operation (discussed herein) under the control of the external device, and transmit the resulting translated diagnostic information to the external device.

If the diagnostic translation device 100 is not in communication with the external device, the controller 110 indicates that the diagnostic translation device 100 is ready to implement a diagnostic translation operation (e.g., indicates "Ready to Test") via the output device 170, at reference 310. At reference 312, the controller 110 enters into a power save mode. At reference 314, the controller 110 checks whether a diagnostic translation operation has been activated by a user via the Start button 134. If not, the process 300 continues to check for activation, at reference 314. Otherwise, if the Start button 134 is activated, the controller 110 exits the power save mode and evaluates signals outputted from the sensors 120, at reference 316. Prior to activating the Start button 134, the user may also select the type of circuit protective device to be monitored via the Selector switch 136. At reference 318, the controller 110 senses that the circuit protective device has been turned on, e.g., placed in the ON position, based on the signals outputted from one or more of the sensors 120.

At reference 320, the controller 110 starts a timer once the circuit protective device is turned on. The controller 110 checks whether a timer overflow condition has occurred, at reference 322. For example, an overflow condition occurs if the timer exceeds a predetermined time threshold. If a timer overflow condition has occurred, the controller 110 indicates that an error has occurred (e.g., indicates "Error") via the output device 170, at reference 324. Otherwise, the controller 110 keeps the timer running and continues to evaluate signals from the sensors 120 for an occurrence of a trip condition, e.g., a TRIPPED position, by the circuit protective device. At reference 326, the controller 110 senses that the circuit protective device has tripped based on the output signals from one or more of the sensors 120. The controller 110 then determines a time period of the trip sequence, e.g., an ON time or duration, of the circuit protective device during a read out operation. For example, the controller 110 calculates a time interval from when a contact of the circuit protective device is initially placed in the ON position (e.g., a closed position) to when the contact trips to the TRIPPED position (e.g., an open position) during the read out operation.

At reference 330, the controller 110 determines a diagnostic condition, such as a type of fault condition, using the diagnostic information database 142 according to at least the determined time period, and stores diagnostic information including the determined diagnostic condition in the translated diagnostic information 144 in the memory 140. The stored diagnostic information may include an identifier of the circuit protective device, a type or sub-type of fault condition and a time/date of the diagnostic translation operation.

At reference 332, the controller 110 indicates the diagnostic information, such as the determined diagnostic condition (e.g., a fault condition), to the user via the output device 170. For example, the determined type of diagnostic condition may be outputted in a graphic display format or an audio format, such as previously discussed above with reference to the process 200 of FIG. 2. At reference 334, the controller 110 enters a power save mode and continues to check for a request to activate a new diagnostic translation operation, such as by the user via the start button 134. At reference 336, the diagnostic translation device 100 is turned off by the user via the On/Off switch 132.

FIGS. 4A and 4B are exemplary diagnostic information databases 400 and 450, respectively, which are shown in a chart form. The databases 400 and 450 are configured to maintain information concerning various types of diagnostic conditions, such as different types of fault conditions or other conditions, which are conveyable by one or more types of circuit protective devices, as a function of a time period of a trip sequence. For example, as shown in FIG. 4A, a circuit protective device can implement a trip sequence having a time period of 2000 milliseconds (or 2 seconds) during a read out operation to indicate that a prior trip event is related to an Arc Fault condition. The diagnostic translation device 100 of FIG. 1 can be used to monitor the trip sequence implemented by the circuit protective device during the read out operation, and to determine a time period of the trip sequence, in this example, 2000 milliseconds. The diagnostic translation device 100 can then determine, from the diagnostic information database 400, that the occurrence of the prior trip event on the circuit protective device is related to an Arc Fault condition given that the determined time period is 2000 milliseconds.

As further shown in FIG. 4A, in the diagnostic information database 400, a Ground Fault condition and a Ground Neutral condition are associated with a trip sequence having a time period of 25 milliseconds and 45 milliseconds, respectively. An Arc Fault condition is associated with a trip sequence having a time period of 2000 milliseconds. An End of Indication condition is associated with a trip sequence having a time period of 5000 milliseconds.

As previously discussed, human senses typically are unable to differentiate between tripping sequences that have time periods that differ in the seconds to sub-second range. As a consequence, a circuit protective device may be restricted in terms of a number of types of fault and other conditions that may be tracked, stored and then conveyed through a tripping sequence implemented as a function of time within a limited time frame (e.g., 5 seconds as shown in FIG. 4A). However, when used in combination with the diagnostic translation device 100, it is possible for a circuit protective device to be configured to track and store a wider range of diagnostic conditions, and convey them through a trip sequence within a limited time frame. For instance, in comparison to the example of FIG. 4A, the diagnostic information database 450 of FIG. 4B includes additional types and sub-types of diagnostic conditions in relation to a time period of a trip sequence for one or more types of circuit protective device (e.g., a single pole circuit breaker, a multi-pole circuit breaker, a Ground Fault Circuit Interrupter, an Arc Fault Circuit Interrupter or combination thereof).

As shown in FIG. 4B, the diagnostic information database 450 includes information concerning sub-types of a diagnostic condition for one or more types of circuit protective devices. For example, the diagnostic information database 450 includes six different sub-types of an Arc Fault condition for two different types of Manufacturers within a time frame of 165 milliseconds, such as follows: 1P Parallel Arc Fault—Manufacturer A (1925 milliseconds), 1P Series Arc Fault—Manufacturer A (1940 milliseconds), 2P Right Pole Parallel Arc Fault—Manufacturer A (1955 milliseconds), 2P Right Pole Series Arc Fault—Manufacturer A (1970 milliseconds), 2P Left Pole Parallel Arc Fault—Manufacturer A (1985 milliseconds), 2P Left Pole Series Arc Fault—Manufacturer A (2000 milliseconds), 1P Parallel Arc Fault—Manufacturer B (2015 milliseconds), 1P Series Arc Fault—Manufacturer B (2030 milliseconds), 2P Right Pole Parallel Arc Fault—Manufacturer B (2045 milliseconds), 2P Right Pole Series Arc Fault—Manufacturer B (2060 milliseconds), 2P Left Pole Parallel Arc Fault—Manufacturer B (2075 milliseconds), and 2P Left Pole Series Arc Fault—Manufacturer B (2090 milliseconds). Furthermore, the diagnostic information database 450 includes information on diagnostic conditions, such as Ground Fault condition, such as follows: Grounded Neutral (25 milliseconds), Ground Fault Threshold One (45 milliseconds), and Ground Fault Threshold Two (60 milliseconds). The diagnostic information database 450 also includes information on other diagnostic conditions, such as follows: Diagnostics Error One (4980 milliseconds), Diagnostic Error Two (4990 milliseconds) and End of Indication (5000 milliseconds). As shown in FIG. 4B, a diagnostic condition may have a time period that differs by less than one second, 100 milliseconds, 60 milliseconds, 15 milliseconds, or even 10 milliseconds from a time period of a different diagnostic condition.

FIGS. 5A, 5B and 5C are exemplary perspective views of a diagnostic translation device, such as the diagnostic translation device 100 of FIG. 1, in accordance with another embodiment. As shown in FIG. 5A, the diagnostic translation device 100 includes a body 510 (e.g., a housing or a case) formed of an insulated material. The sensors of the diagnostic translation device 100 can include an electrical probe 520 and a microphone 522, either of which can be used to sense an ON position and a TRIPPED position of a previously tripped circuit protective device that is connected to a circuit. In this example, the electrical probe 520 includes an electrical three-prong plug configured to engage an electrical receptacle (e.g., an outlet receptacle) that is connected to the circuit, and allows sensing of voltage or current through the circuit or a load connected to the circuit. The electrical plug provides a safe and easy way for a user to monitor a trip sequence implemented by the circuit protective device, without having to come in contact or proximity to live conductors. However, the electrical probe 520 can include other types of voltage or current probes, which can be used to sense a voltage or a current on the circuit protective device at a circuit breaker panel or other locations on the circuit. Furthermore, the microphone 522 can be placed in proximity to the circuit protective device to sense sounds associated with the mechanical operations of the circuit protective device.

The diagnostic translation device 100 also includes user interfaces, such as the On/Off switch 132, Start button 134 and the Selector switch 136. In this example, the Selector switch 136 is movable between three positions to select one of three different types of circuit protective devices to be monitored, e.g., Type A, Type B or Type C. The output devices of the diagnostic translation device 100 can include a display 540, a plurality of LEDs 542 and a speaker 544. The display 540 can be a touch-screen display.

As further shown in FIG. 5B, the diagnostic translation device 100 can output information concerning a prior trip event that has occurred on a circuit protective device. The outputted information is based on diagnostic information translated by monitoring a trip sequence implemented by the circuit protective device during a read out operation, such as described above with reference to FIGS. 2 and 3. In this example, the diagnostic translation device 100 outputs information via the display 540, such as the type of circuit protective device (e.g., XXXXX), the time period of the trip sequence (e.g., 1955 milliseconds), and diagnostic information concerning the trip event (e.g., Arc Fault Condition and 2P Right Pole Parallel Arc Fault of the circuit protective device from Manufacturer A).

FIG. 5C shows a back view of the diagnostic translation device 100. As shown in FIG. 5C, the diagnostic translation device 100 may include a plurality of magnets 550. The magnets 550 allow a user to place the diagnostic translation device 100 on any suitable metal surface, such as on a load center (e.g., a circuit breaker panel). In this way, the user does not need to continuously hold the diagnostic translation device 100 when implementing a diagnostic translation operation.

For example, the magnets 550 are particularly useful when sensing an acoustic signature of the ON position and TRIPPED position with the microphone 522 (such as shown in FIG. 5A). The user can attach the diagnostic translation device 100 to a suitable metal surface on a circuit breaker panel near a previously tripped circuit protective device to be monitored, turn on the diagnostic translation device 100, and start a diagnostic translation operation. The user can then initiate a read out operation by the circuit protective device (which may involve resetting the circuit protective device to the ON position), without having to hold onto the diagnostic translation device 100. Thereafter, the diagnostic translation device 100 automatically senses the ON position and subsequent TRIPPED position of a trip sequence implemented by the circuit protective device 100 during the readout operation and determines a time period of the trip sequence. The diagnostic translation device 100 then determines diagnostic information according to the determined time period, and outputs to the user the information which relates to a prior trip event on the circuit protective device, such as shown in FIG. 5B.

Although the diagnostic translation device 100, as described herein, can be used with circuit protective devices such as a circuit breaker or a circuit interrupter, it may be used with any device or system configured to convey different types of information through a tripping sequence implemented as a function of time. For example, it may be used to translate diagnostic information from add-on modules of a circuit breaker, from receptacles or other devices integrated with or in communication with a circuit breaker. It may also be used to translate diagnostic information concerning other types of events, other than a trip event, that is tracked and stored by the circuit protective device. Furthermore, the diagnostic translation device 100 is described as a handheld device but can also be incorporated into or added onto a load center.

While particular embodiments and applications of the present disclosure have been illustrated and described, it is to be understood that the present disclosure is not limited to the precise construction and compositions disclosed herein and that various modifications, changes, and variations can be apparent from the foregoing descriptions without departing from the spirit and scope of the invention as defined in the appended claims.

The invention claimed is:

1. A method of translating diagnostic information provided by a circuit protective device, the method comprising:
    monitoring through a sensor a diagnostic trip sequence implemented by a circuit protective device as a function of time during a read out operation to indicate a type of fault condition from a plurality of fault conditions for a prior occurrence of a trip event or diagnostic information;
    determining a time period of the monitored diagnostic trip sequence;
    determining the type of fault condition based on the determined time period; and outputting information indicating the determined type of fault condition,
    wherein the diagnostic trip sequence comprises a sequence of operations performed by the circuit protective device from turning ON to tripping of the circuit protective device, and is initiated after an occurrence of the trip event on the circuit protective device, and
    wherein different time periods for a diagnostic trip sequence correspond to different types of fault conditions.

2. The method according to claim 1, wherein the time period is a time interval from when a contact of the circuit protective device is initially placed in a closed position to when the contact trips to an open position during the read out operation.

3. The method according to claim 1, wherein monitoring comprises sensing sounds associated with a mechanical operation of the circuit protective device.

4. The method according to claim 1, wherein monitoring comprises sensing one of a voltage or a current on a circuit connected to the circuit protective device.

5. The method according to claim 4, wherein sensing comprises engaging an electrical probe to an electrical receptacle that is connected to the circuit.

6. The method according to claim 1, further comprising storing in memory information of the determined type of fault condition of the prior trip event for the circuit protective device.

7. The method according to claim 1, wherein determining the outputting of the type of fault condition comprises:
    searching a diagnostic information database that stores data concerning the plurality of fault conditions in relation to time; and identifying a type of fault condition that matches the determined time period from the diagnostic information database.

8. The method according to claim 1, wherein two different types of fault conditions from the plurality of fault conditions are associated with time periods which are in the seconds to sub-second range apart from each other.

9. The method according to claim 1, wherein the type of fault condition is determined based on the determined time period and a type of the circuit protective device.

10. An apparatus for translating diagnostic information provided by a 3 circuit protective device, the apparatus comprising:
a memory;
a sensor for monitoring an operation of a circuit protective device;
an output device;
a controller in communication with the memory, the sensor and the output device and configured to:
monitor through the sensor a diagnostic trip sequence implemented by the circuit protective device as a function of time during a read out operation to indicate a type of fault condition from a plurality of fault conditions for a prior occurrence of a trip event or diagnostic information;
determine a time period of the monitored diagnostic trip sequence;
determine the type of fault condition based on the determined time period; and
indicate the determined type of fault condition though the output device,
wherein the diagnostic trip sequence comprises a sequence of operations performed by the circuit protective device from turning ON to tripping of the circuit protective device, and is initiated after an occurrence of the trip event on the circuit protective device, and
wherein different time periods for a diagnostic trip sequence correspond to different types of fault conditions.

11. The apparatus according to claim 10, wherein the time period is a time interval from when a contact of the circuit protective device is initially placed in a closed position to when the contact trips to an open position during the read out operation.

12. The apparatus according to claim 10, wherein the sensor comprises an acoustic sensor for sensing sounds associated with a mechanical operation of the circuit protective device.

13. The apparatus according to claim 10, wherein the sensor comprises an electrical 4 probe for sensing one of a voltage or a current on a circuit connected to the circuit protective device.

14. The apparatus according to claim 10, wherein the controller is further configured to store in the memory information of the determined type of fault condition of the prior trip event for the circuit protective device.

15. The apparatus according to claim 10, wherein to determine the output of the type of fault condition, the controller searches a diagnostic information database that stores data concerning the plurality of fault conditions in relation to time, and identifies a type of fault condition that matches the determined time period from the diagnostic information database.

16. The apparatus according to claim 10, wherein two different types of fault conditions from the plurality of fault conditions are associated with time periods which are in the seconds to sub-second range apart from each other.

17. The apparatus according to claim 10, wherein the controller is configured to determine the type of fault condition based on the determined time period and a type of the circuit protective device.

* * * * *